(12) United States Patent
Okada

(10) Patent No.: US 7,384,858 B2
(45) Date of Patent: Jun. 10, 2008

(54) WAFER DIVIDING METHOD

(75) Inventor: Jun Okada, Tokyo (JP)

(73) Assignee: Disco Corporation, Tokyo (JP)

( * ) Notice: Subject to any disclaimer, the term of this patent is extended or adjusted under 35 U.S.C. 154(b) by 0 days.

(21) Appl. No.: 11/167,513

(22) Filed: Jun. 28, 2005

(65) Prior Publication Data

US 2006/0003552 A1    Jan. 5, 2006

(30) Foreign Application Priority Data

Jul. 1, 2004    (JP)    ............................ 2004-195553

(51) Int. Cl.
*H01L 21/00* (2006.01)
(52) U.S. Cl. .............. 438/462; 257/E21.599; 257/E21.602
(58) Field of Classification Search ............ 438/459, 438/460, 462, 458, FOR. 386; 257/E21.599, 257/E21.602
See application file for complete search history.

(56) References Cited

U.S. PATENT DOCUMENTS

2002/0055238 A1* 5/2002 Sugino et al. .............. 438/459
2003/0186513 A1* 10/2003 Turner et al. ............... 438/462
2005/0233549 A1* 10/2005 Eshleman ................... 438/462

FOREIGN PATENT DOCUMENTS

JP    2003-17442    1/2003

* cited by examiner

*Primary Examiner*—Matthew S. Smith
*Assistant Examiner*—Quovaunda Jefferson
(74) *Attorney, Agent, or Firm*—Smith, Gambrell & Russell, LLP

(57) ABSTRACT

A wafer dividing method for dividing a wafer along a first set of plural streets extending parallel to each other, and a second set of plural streets extending parallel to each other and extending perpendicularly to the first set of the streets, the wafer having a plurality of rectangular regions defined on the face thereof by these streets. The wafer dividing method includes a groove forming step of forming grooves along the streets on the face of the wafer, and a grinding step of grinding the back of the wafer after the groove forming step. The grooves formed by the groove forming step include grooves having a first depth D1, and grooves having a second depth D2 which is greater than the first depth D1 (D2>D1).

1 Claim, 4 Drawing Sheets

WAFER DIVIDING METHOD

FIELD OF THE INVENTION

This invention relates to a wafer dividing method for dividing a wafer along a first set of plural streets extending parallel to each other, and a second set of plural streets extending parallel to each other and extending perpendicularly to the first set of the streets, the wafer having a plurality of rectangular regions defined on the face thereof by the first set of the streets and the second set of the streets. More particularly, the present invention relates to a wafer dividing method arranged to divide the wafer in a mode called dicing-before-grinding, namely, a mode including a groove forming step of forming grooves along the streets on the face of the wafer, and a grinding step of grinding the back of the wafer after the groove forming step.

DESCRIPTION OF THE PRIOR ART

In the production of a semiconductor device, a plurality of rectangular regions are defined on the face of a wafer by streets arranged in a lattice pattern, namely, a first set of plural streets extending parallel to each other, and a second set of plural streets extending parallel to each other and extending perpendicularly to the first set of the streets, and a circuit element is disposed in each of the rectangular regions. The wafer is divided along the streets, whereby the wafer is separated into individual rectangular regions, namely, semiconductor devices.

If it is particularly necessary to render the thickness of the semiconductor device sufficiently small, a mode called dicing-before-grinding has been proposed as a mode for dividing the wafer along the streets, as disclosed in Japanese Patent Application Laid-Open No. 2003-17442, and this mode has found practical use. In this mode, grooves are formed along the streets on the face of the wafer and, then, the back of the wafer is ground to render the thickness of the wafer substantially the same as, or smaller than, the depth of the grooves, whereby the wafer is divided along the streets.

According to the inventor's experience, however, the dividing method in the mode called dicing-before-grinding has been found to have a tendency toward chipping occurring, particularly, at the corner of the individually separated rectangular region, namely, semiconductor device.

SUMMARY OF THE INVENTION

It is an object of the present invention, therefore, to improve the wafer dividing method in the mode called dicing-before-grinding so that chipping of the semiconductor device can be avoided.

The inventor diligently conducted studies on conventional wafer dividing methods, and has recognized the following facts: With the conventional wafer dividing methods, all grooves formed along the streets on the face of the wafer have substantially the same depth. Thus, divisions along the streets by grinding of the back of the wafer occur substantially simultaneously along all of the streets. On this occasion, the individually separated semiconductor devices are vibrated finely. Owing to such vibrations, chipping takes place particularly at the corner of the semiconductor device.

Based on this recognition, the inventor formed at least two depths of grooves along the streets on the face of the wafer, and designed the divisions of the wafer along the streets by grinding the back of the wafer not to occur substantially simultaneously along all the streets, but to occur with a time lag, in at least two stages. By so doing, the inventor has found that the aforementioned object can be attained.

That is, according to the present invention, as a wafer dividing method for attaining the above object, there is provided a wafer dividing method for dividing a wafer along a first set of plural streets extending parallel to each other, and a second set of plural streets extending parallel to each other and extending perpendicularly to the first set of the streets, the wafer having a plurality of rectangular regions defined on the face thereof by the first set of the streets and the second set of the streets, the wafer dividing method including a groove forming step of forming grooves along the streets on the face of the wafer, and a grinding step of grinding the back of the wafer after the groove forming step, and wherein the grooves formed by the groove forming step include grooves having a first depth D1, and grooves having a second depth D2 which is greater than the first depth D1 (D2>D1).

Preferably, the grooves formed along the first set of the streets have the first depth D1, and the grooves formed along the second set of the streets have the second depth D2. It is also preferred that the grooves formed along the first set of the streets include grooves of the first depth D1 and grooves of the second depth D2 arranged alternately, and the grooves formed along the second set of the streets similarly include grooves of the first depth D1 and grooves of the second depth D2 arranged alternately.

DETAILED DESCRIPTION OF THE PREFERRED EMBODIMENTS

Figure 1:
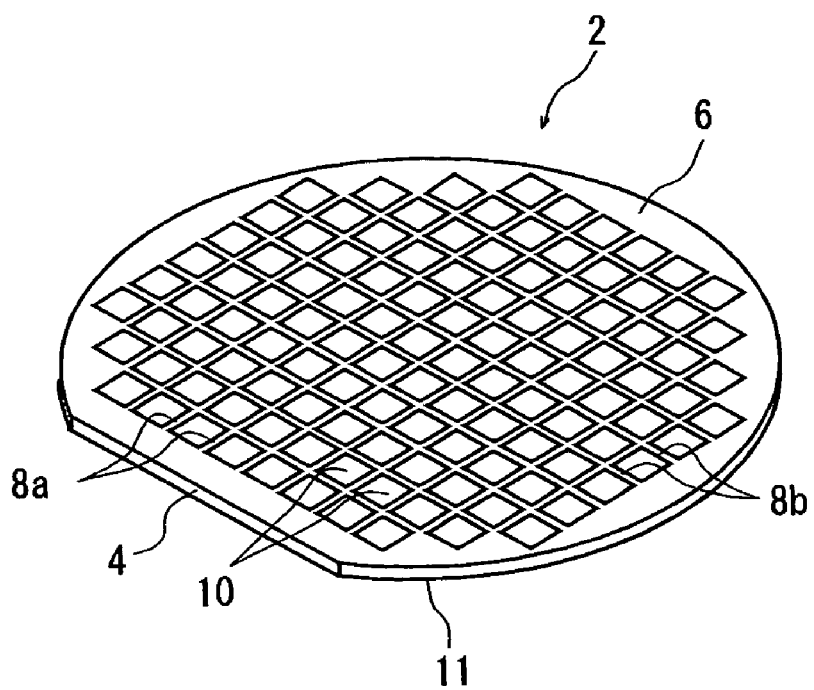
FIG. 1 is a perspective view showing an example of a wafer to which the wafer dividing method of the present invention is applied.

FIG. 1 shows an example of a wafer to which the wafer dividing method of the present invention is applied. The illustrated wafer entirely indicated at the numeral 2, which may be a silicon wafer, is of a thin disk shape as a whole, and has an arcuate edge, except a straight edge 4 called an orientation flat. On the face 6 of the wafer 2, a plurality of rectangular regions 10 are defined by a first set of plural streets 8a and a second set of plural streets 8b. The first set of the streets 8a extend parallel to each other, and the second set of the streets 8b also extend parallel to each other. The second set of the streets 8b extend perpendicularly to the first set of the streets 8a. A suitable circuit element is disposed in each of the rectangular regions 10.

Figure 2:
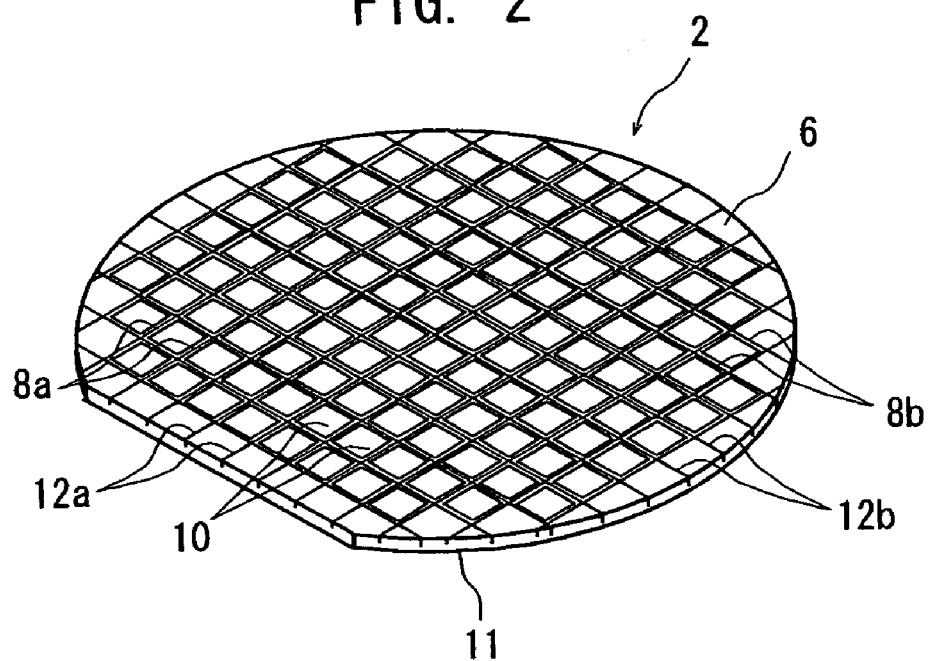
FIG. 2 is a perspective view showing a state in which grooves have been formed along streets on the face of the wafer of FIG. 1 in the groove forming step.

In the wafer dividing method of the present invention, as shown in FIG. 2, a groove forming step of forming grooves 12a and 12b along the streets 8a and 8b on the face 6 of the wafer 2 is performed before the back 11 of the wafer 2 is ground to decrease the thickness of the wafer 2. The formation of the grooves 12a and 12b can be carried out by a dicer shown, for example, in FIG. 3 of the aforementioned Japanese Patent Application Laid-Open No. 2003-17442. Such a dicer is equipped with a cutting blade of a thin annular plate shape (not shown) containing diamond grains. This cutting blade is rotated at a high speed and caused to act on the wafer 2. In this state, the wafer 2 and the cutting blade are moved relative to each other along the streets 8a and 8b, whereby the grooves 12a and 12b are formed on the face 6 of the wafer 2. Instead of forming the grooves 12a and 12b by the dicer equipped with the cutting blade, it is possible to form the grooves 12a and 12b by applying pulsed laser light to the wafer 2 along the streets 8a and 8b, as is well known among those skilled in the art.

Figure 3:
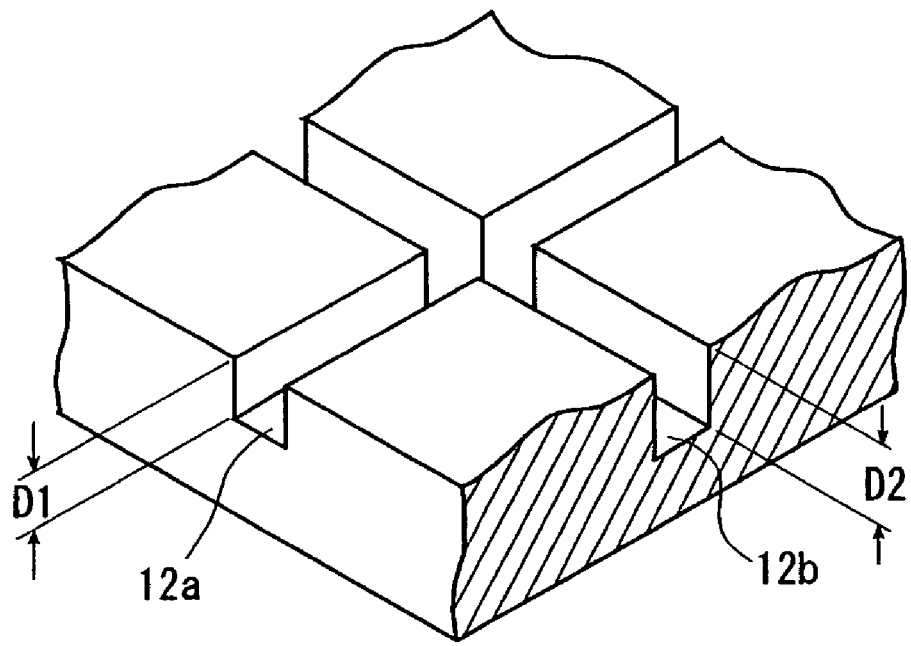
FIG. 3 is an enlarged partial perspective view showing a state in which grooves have been formed along streets on the face of the wafer of FIG. 1 in the groove forming step.

In the wafer dividing method of the present invention, it is important that the grooves 12a and 12b include grooves of at least two depths. With further reference to FIG. 3 along with FIG. 2, the depths of the grooves 12a formed along the streets 8a are all D1, in the illustrated embodiment. On the other hand, the depths of the grooves 12b formed along the streets 8b are all D2, and D2 is greater than D1 (D2>D1). The difference between D2 and D1 (D2−D1) is preferably of the order of 1 to 5 μm and, particularly, of the order of 2 to 4 μm.

Figure 4:
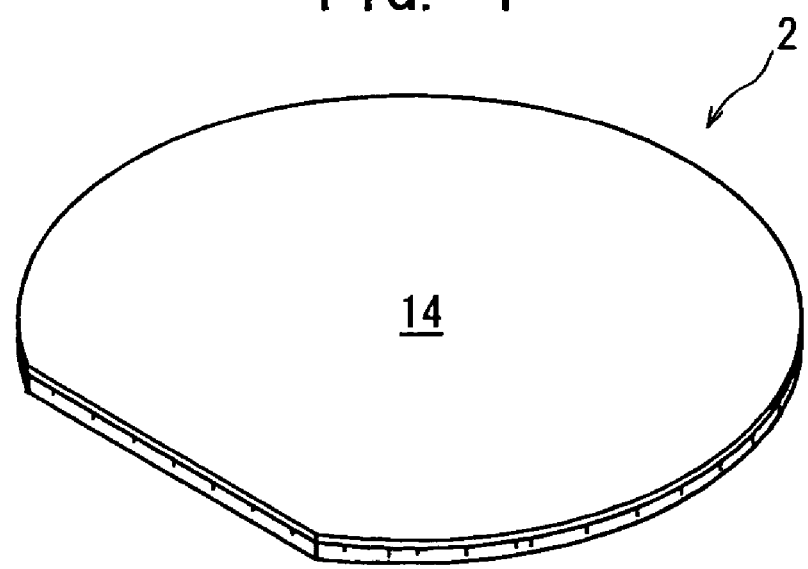
FIG. 4 is a perspective view showing a state in which a protective tape has been affixed to the face of the wafer shown in FIGS. 2 and 3.

After the grooves 12a and 12b as described above are formed, a protective tape 14 is affixed to the face 6 of the wafer 2, as shown in FIG. 4. The protective tape 14 may be a suitable synthetic resin film or sheet such as a polyester film or sheet.

Figure 5:
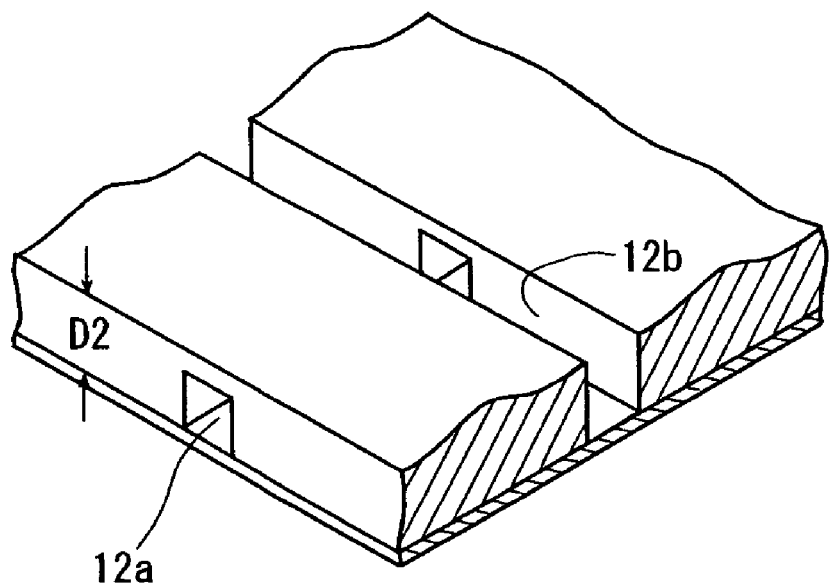
FIG. 5 is an enlarged partial perspective view showing a state in which the wafer shown in FIG. 4 has been placed facedown, and the back of the wafer has been ground to decrease the thickness of the wafer to a predetermined value.
Figure 6:
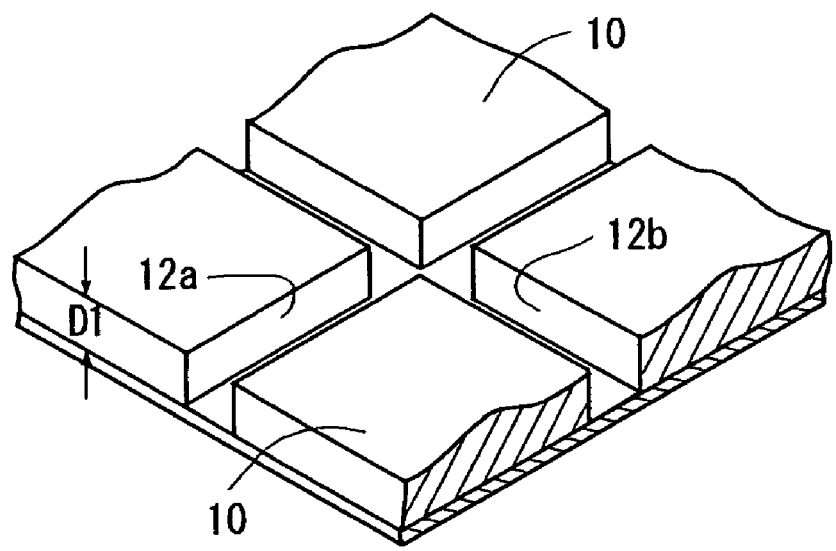
FIG. 6 is an enlarged partial perspective view showing a state in which the back of the wafer has been further ground from the state shown in FIG. 5 to decrease the thickness of the wafer further.

Then, a grinding step of grinding the back 11 of the wafer 2 is performed. The grinding step can be advantageously performed by a grinding machine disclosed, for example, in FIG. 11 of the aforementioned Japanese Patent Application Laid-Open No. 2003-17442. When the back 11 of the wafer 2 is to be ground by such a grinding machine, the wafer 2 is vacuum attracted onto a chuck (not shown), with the face 6 having the protective tape 14 affixed thereto being pointed downward, accordingly, with the back 11 to be ground being pointed upward in an exposed state, as is well known among those skilled in the art. In this condition, a grinding wheel (not shown) being rotated at a high speed is caused to act on the back 11 of the wafer 2. The grinding wheel has a grinding implement containing diamond grains. As shown in FIG. 5, the back 11 of the wafer 2 is ground to decrease the thickness of the wafer 2 to the depth D2 of the groove 12b, whereby the wafer 2 is divided along the streets 8b. When the back 11 of the wafer 2 is further ground to decrease the thickness of the wafer 2 to the depth D1 of the groove 12a, whereby the wafer 2 is also divided along the streets 8a, as shown in FIG. 6. As a result, the rectangular regions 10 of the wafer 2 are individually separated. Each of the individually separated rectangular regions 10 constitutes a semiconductor device. If desired, the back 11 of the wafer 2 can be ground further to decrease the thickness of each rectangular region 10 further.

According to the wafer dividing method of the present invention, when the back 11 of the wafer 2 is ground, the divisions of the wafer 2 along the grooves 12a and 12b do not occur simultaneously as done in the case of the conventional wafer dividing method. Instead, these divisions occur such that the division of the wafer 2 along the grooves 12b occurs first, and then the division of the wafer 2 along the grooves 12a occurs with some time lag. In comparison with the conventional wafer dividing method, therefore, vibrations of each rectangular region 10 during grinding of the back 11 of the wafer 2 are effectively suppressed, and chipping particularly at the corner of each rectangular region 10 is effectively avoided or suppressed.

Figure 7:
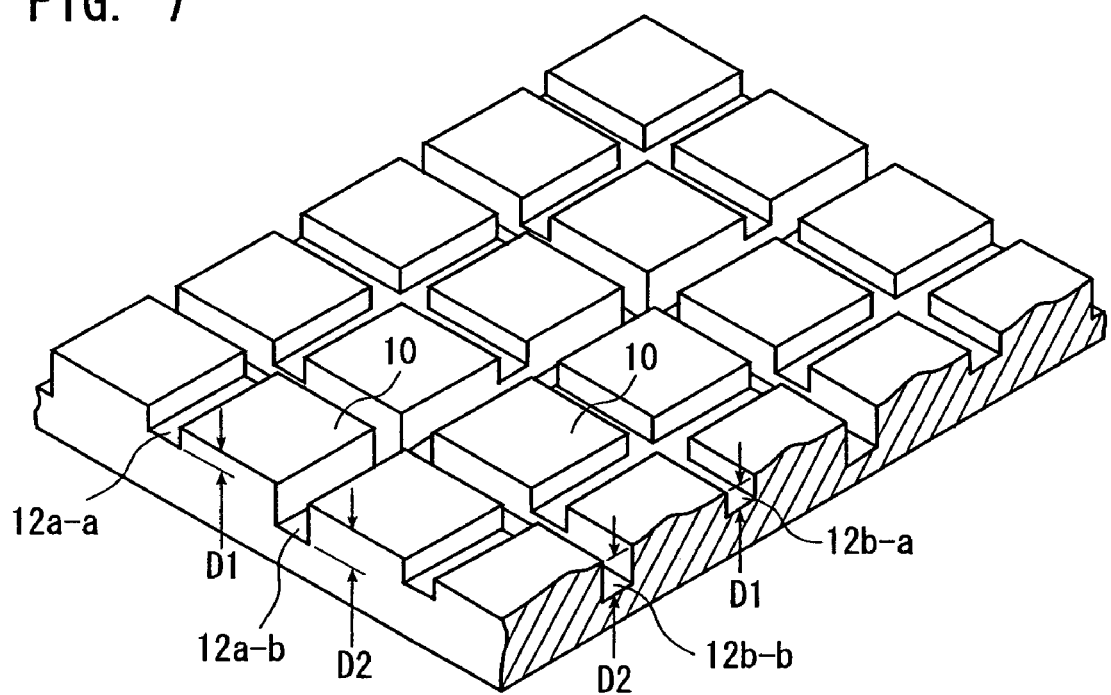
FIG. 7 is an enlarged partial perspective view showing a state in which grooves have been formed along the streets on the face of the wafer of FIG. 1 in a modified form of the groove forming step.

FIG. 7 shows a modified example of the groove forming step in the wafer dividing method of the present invention. In the modified example illustrated in FIG. 7, grooves formed along the first set of the streets 8a include grooves 12a-a having a depth D1 and grooves 12a-b having a depth D2, and the grooves 12a-a and the grooves 12a-b are positioned alternately. Similarly, grooves formed along the second set of the streets 8b include grooves 12b-a having a depth D1 and grooves 12b-b having a depth D2, and the grooves 12b-a and the grooves 12b-b are positioned alternately. In the grinding step of grinding the back 11 of the wafer 2, the back 11 of the wafer 2 is ground to decrease the thickness of the wafer 2 to the depth D2 of the grooves 12a-b and 12b-b, whereby the wafer 2 is divided along the grooves 12a-b and 12b-b. When the back 11 of the wafer 2 is further ground to decrease the thickness of the wafer 2 to the depth D1 of the grooves 12a-a and 12b-a, the wafer 2 is divided along the grooves 12a-a and 12b-a. As a result, the rectangular regions 10 are individually separated.

While the preferred embodiments of the wafer dividing method constructed according to the present invention have been described by reference to the accompanying drawings, it is to be understood that the present invention should not be limited to such embodiments, but various changes and modifications may be made without departing from the scope of the present invention.

In the illustrated embodiments, for example, the two depths D1 and D2 are imparted to the grooves formed along the streets. If desired, however, three or more depths can be provided.

What I claim is:

1. A wafer dividing method for dividing a wafer along a first set of plural streets extending parallel to each other, and a second set of plural streets extending parallel to each other and extending perpendicularly to the first set of the streets, the wafer having a plurality of rectangular regions defined on a face thereof by the first set of streets and the second set of streets, the wafer dividing method including:

a groove forming step of forming grooves along the streets on the face of the wafer, and a grinding step of grinding a back of the wafer after the groove forming step, wherein the grooves formed by the groove forming step include grooves having a first depth D1, and grooves having a second depth D2 which is greater than the first depth D1 (D2>D1), the thickness of the wafer is decreased to D2 or less by the grinding step so that the rectangular regions are individually separated, and the grooves formed along the first set of streets include grooves of the first depth D1 and grooves of the second depth D2 arranged alternately, and the grooves formed along the second set of streets similarly include grooves of the first depth D1 and grooves of the second depth D2 arranged alternately.

* * * * *